(12) United States Patent  
Sawarkar

(10) Patent No.: US 8,732,511 B2  
(45) Date of Patent: May 20, 2014

(54) RESISTOR LADDER BASED PHASE INTERPOLATION

(75) Inventor: Prasad Sawarkar, Bangalore (IN)

(73) Assignee: LSI Corporation, San Jose, CA (US)

( * ) Notice: Subject to any disclaimer, the term of this patent is extended or adjusted under 35 U.S.C. 154(b) by 313 days.

(21) Appl. No.: 13/248,363

(22) Filed: Sep. 29, 2011

(65) Prior Publication Data

US 2013/0082752 A1 Apr. 4, 2013

(51) Int. Cl.
*G06F 1/00* (2006.01)
*G06F 1/04* (2006.01)

(52) U.S. Cl.
USPC ............................ 713/503; 713/500; 713/501

(58) Field of Classification Search
USPC .......... 327/113, 144, 147, 156, 162; 713/400, 713/600, 503, 500, 501
See application file for complete search history.

(56) References Cited

U.S. PATENT DOCUMENTS

| | | | | |
|---|---|---|---|---|
| 5,671,258 A * | 9/1997 | Burns et al. | ..................... | 375/359 |
| 5,920,494 A * | 7/1999 | Setbacken et al. | ............ | 708/290 |
| 6,043,717 A * | 3/2000 | Kurd | ................ | 331/17 |
| 6,529,152 B1 | 3/2003 | Piasecki et al. | ................ | 341/144 |
| 6,777,994 B2 | 8/2004 | Chou et al. | .................... | 327/269 |
| 7,251,305 B2 * | 7/2007 | Gauthier et al. | .............. | 375/376 |
| 7,508,871 B2 | 3/2009 | Zerbe et al. | .................... | 375/229 |
| 7,643,583 B1 | 1/2010 | Savoj et al. | ..................... | 375/340 |
| 7,659,763 B2 | 2/2010 | Camara et al. | ................ | 327/292 |
| 2002/0009170 A1* | 1/2002 | Schmatz | ....................... | 375/371 |
| 2003/0169114 A1 | 9/2003 | Manapragada et al. | ...... | 330/279 |
| 2004/0247027 A1 | 12/2004 | Wang | .............................. | 375/239 |
| 2005/0068216 A1* | 3/2005 | Mulder et al. | ................ | 341/154 |
| 2007/0018702 A1* | 1/2007 | Lee | ................................. | 327/158 |
| 2007/0075756 A1* | 4/2007 | Metz | .............................. | 327/158 |
| 2007/0090867 A1 | 4/2007 | Kim | .............................. | 327/291 |
| 2007/0268963 A1* | 11/2007 | Wallace et al. | ............... | 375/226 |
| 2008/0246537 A1* | 10/2008 | Aziz | ............................. | 327/540 |
| 2009/0284297 A1 | 11/2009 | Ebuchi | ......................... | 327/291 |
| 2011/0102028 A1 | 5/2011 | Nedachi | ........................ | 327/144 |
| 2011/0114827 A1* | 5/2011 | Yamaoka et al. | ......... | 250/214 R |
| 2011/0236027 A1* | 9/2011 | Nosaka et al. | ................ | 398/135 |
| 2012/0200341 A1* | 8/2012 | Mei | ................................ | 327/536 |

* cited by examiner

*Primary Examiner* — Thomas J Cleary
(74) *Attorney, Agent, or Firm* — Christopher P. Maiorana, PC

(57) ABSTRACT

An apparatus comprising a reference circuit, a resistor ladder, and an output circuit. The reference circuit may be configured to generate a reference signal in response to (i) a clock signal, (ii) a first phase signal and (iii) a second phase signal. The resistor ladder circuit may be configured to generate a tap voltage in response to the reference signal. The tap voltage may be generated by enabling one or more of a plurality of tap resistors. The output circuit may be configured to generate an adjusted clock signal in response to (i) the tap voltage, (ii) the clock signal, (iii) the first phase signal, (iv) the second phase signal, and (v) a reset signal. The adjusted clock signal may have an adjusted phase with respect to the clock signal.

10 Claims, 8 Drawing Sheets

RESISTOR LADDER BASED PHASE INTERPOLATION

FIELD OF THE INVENTION

The present invention relates to timing circuits generally and, more particularly, to a method and/or apparatus for implementing a resistor ladder based phase interpolation circuit.

BACKGROUND OF THE INVENTION

Conventional timing circuits often have phase variations that need to be adjusted by phase interpolation circuits. Phase interpolation circuits are used in clocking circuits such as Clock/Data Recovery circuits (CDRs), Spread Spectrum Phase Locked Loops (PLLs), etc. The desirable specifications of the phase interpolation circuits are that they should be monotonic and linear in operation.

It would be desirable to implement a resistor ladder based phase interpolation.

SUMMARY OF THE INVENTION

The present invention concerns an apparatus comprising a reference circuit, a resistor ladder, and an output circuit. The reference circuit may be configured to generate a reference signal in response to (i) a clock signal, (ii) a first phase signal and (iii) a second phase signal. The resistor ladder circuit may be configured to generate a tap voltage in response to the reference signal. The tap voltage may be generated by enabling one or more of a plurality of tap resistors. The output circuit may be configured to generate an adjusted clock signal in response to (i) the tap voltage, (ii) the clock signal, (iii) the first phase signal, (iv) the second phase signal, and (v) a reset signal. The adjusted clock signal may have an adjusted phase with respect to the clock signal.

The objects, features and advantages of the present invention include providing phase interpolation that may (i) implement a resistor ladder, (ii) provide a phase adjustment, (iii) be implemented as part of a Phase Locked Loop (PLL) circuit, (iv) be implemented as part of a clock and data recovery (CDR) circuit and/or (v) provide a monotonic and/or linear operation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
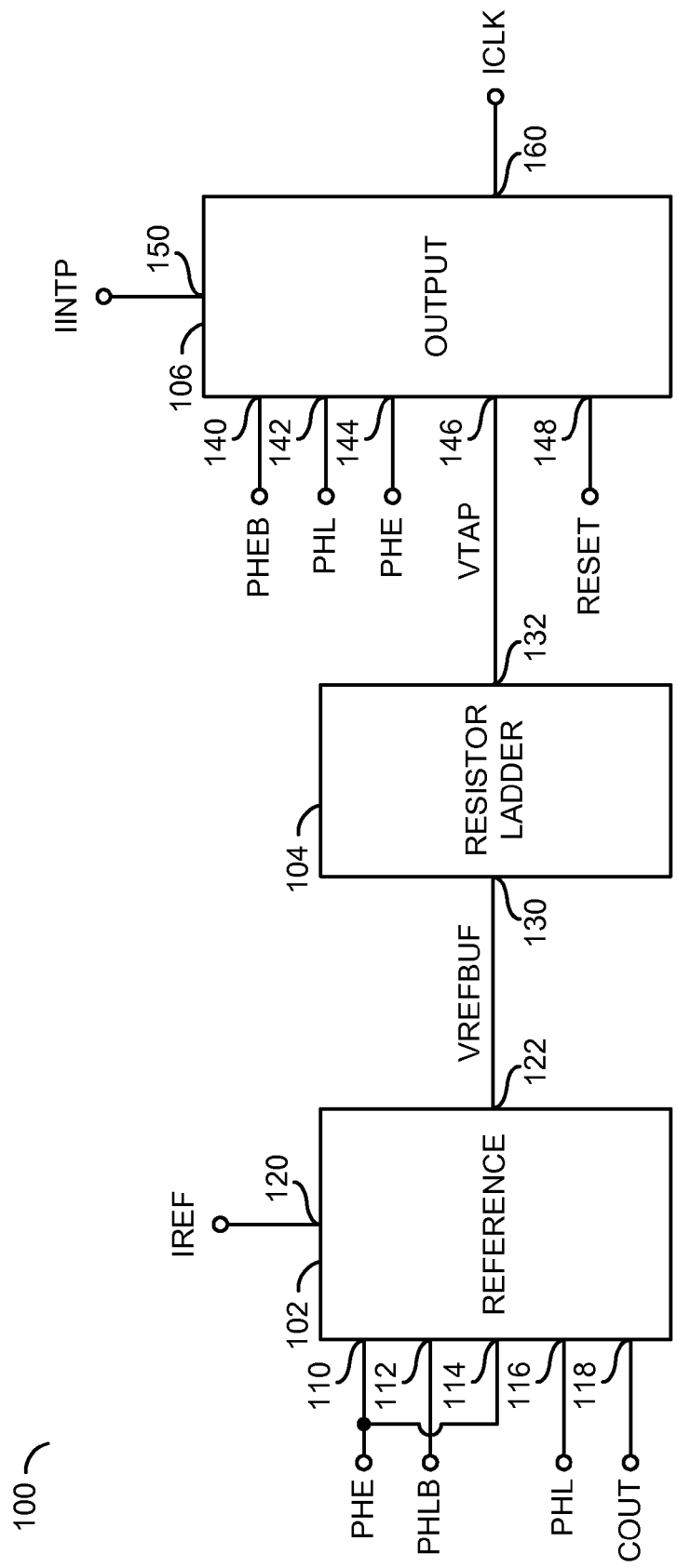
FIG. 1 is a block diagram of the present invention.

Referring to FIG. 1, a block diagram of a circuit 100 is shown in accordance with an embodiment of the present invention. The circuit 100 generally comprises a block (or circuit) 102, a block (or circuit) 104 and a block (or circuit) 106. The block 102 may be implemented as a reference circuit. The block 104 may be implemented as a resistor ladder circuit. The block 106 may be implemented as an output circuit. The circuit 102 may have an input 110 that may receive a signal (e.g., PHE), an input 112 that may receive a signal (e.g., PHLB), an input 114 that may receive the signal PHE, an input 116 that may receive a signal (e.g., PHL), an input 118 that may receive a signal (e.g., COUT), an input 120 that may receive a signal (e.g., IREF), and an output 122 that may present (or generate) a signal (e.g., VREFBUF).

The circuit 104 may have an input 130 that may receive the signal the signal VREFBUF, and an output 132 that may present a signal (e.g., VTAP). The circuit 106 may have an input 140 that may receive a signal (e.g., PHEB), an input 142 that may receive a signal PHL, an input 144 that may receive the signal PHE, an input 146 that may receive the signal VTAP, an input 148 that may receive a signal (e.g., RESET), an input 150 that may receive a signal (e.g., IINTP), and an output 160 that may present a signal (e.g., ICLK).

The signal PHE may represent a phase early signal. The signal PHL may represent a phase late signal. The signal PHE and the signal PHL may have a phase difference (e.g., Tp), where Tp is ⅛ of the total period of the clock signal ICLK. The signal PHLB may be an inverted version (e.g., digital complement) of the signal PHL. The signal PHEB may be an inverted version (e.g., digital complement) of the signal PHE. The signal VREFBUF may be implemented as a reference voltage. The signal VTAP may be implemented as a tap voltage.

Figure 2:
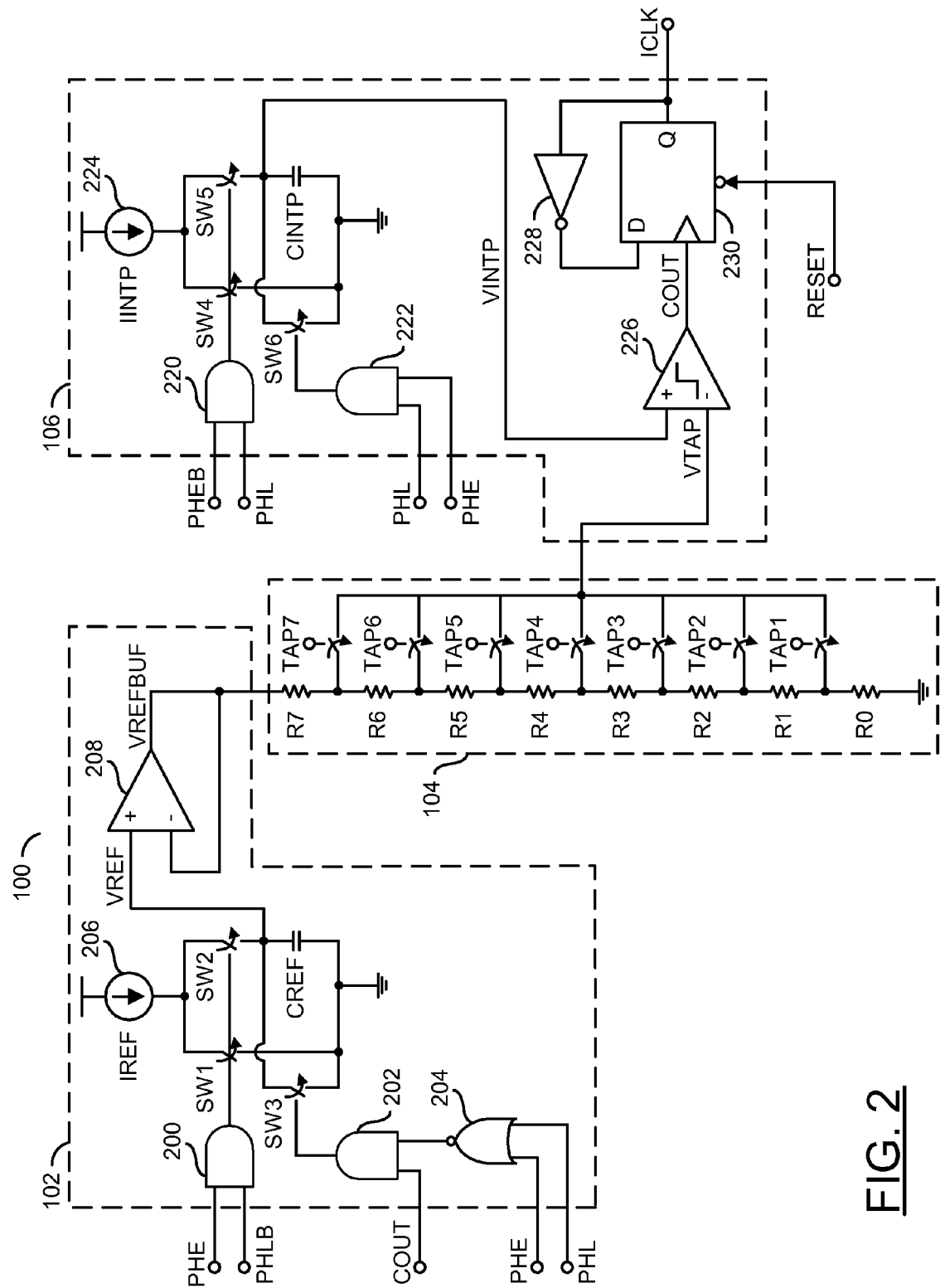
FIG. 2 is a circuit diagram of the circuit of FIG. 1.

Referring to FIG. 2, a more detailed diagram of the circuit 100 is shown. The circuit 102 generally comprises a switch (e.g., SW1), a switch (e.g., SW2), a switch (e.g., SW3), a capacitor (e.g., CREF), a gate 200, a gate 202, a gate 204, a device 206 and a device 208. The gate 200 and/or the gate 202 may be implemented as one or more AND gates. The gate 204 may be implemented an NOR gate. The particular implementation of the gates 200, 202 and/or 204 may be varied to meet the design criteria of a particular implementation. The device 206 may be implemented as a current source configured to generate a current (e.g., IREF). The device 208 may be implemented as a differential amplifier.

The circuit 104 generally comprises a number of circuits TAP1-TAP7 and a number of resistors R0-R7. The circuits TAP1-TAP7 may be implemented as tap circuits. One or more of the circuits TAP1-TAP7 may be enabled (e.g., turned "ON") in response to the signal VREFBUF. The circuit 106 generally comprises a device 220, a switch (e.g., SW4), a switch (e.g., SW5), a switch (e.g., SW6), a capacitor (e.g., CINTP), a device 220, a device 222, a device 224, a device 226, a device 228, and a device 230. In one example, the device 220 and/or the device 222 may be implemented as one or more AND gates. In one example, the device 224 may be implemented as a current source configured to generate a current (e.g., IINTP). In one example, the device 226 may be implemented as a comparator circuit. In one example, the device 228 may be implemented as an inverter. In one example, the device 230 may be implemented as a latch. In one example, the device 230 may be implemented as a D-type latch.

Figure 3:
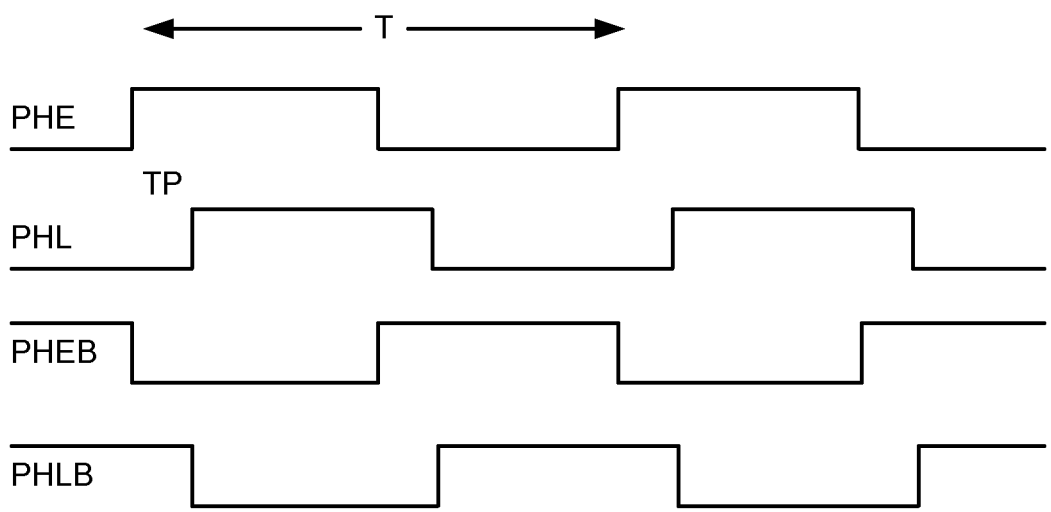
FIG. 3 is a timing diagram of the various signals of FIGS. 1 and 2.

Referring to FIG. 3, the phase signals PHE (phase early) and PHL (phase late) are shown. The respective complimentary phases PHEB and PHLB are also shown. The two phases PHE and PHL have a phase difference of Tp where Tp, is ⅛ of total clock period T.

Figure 4:
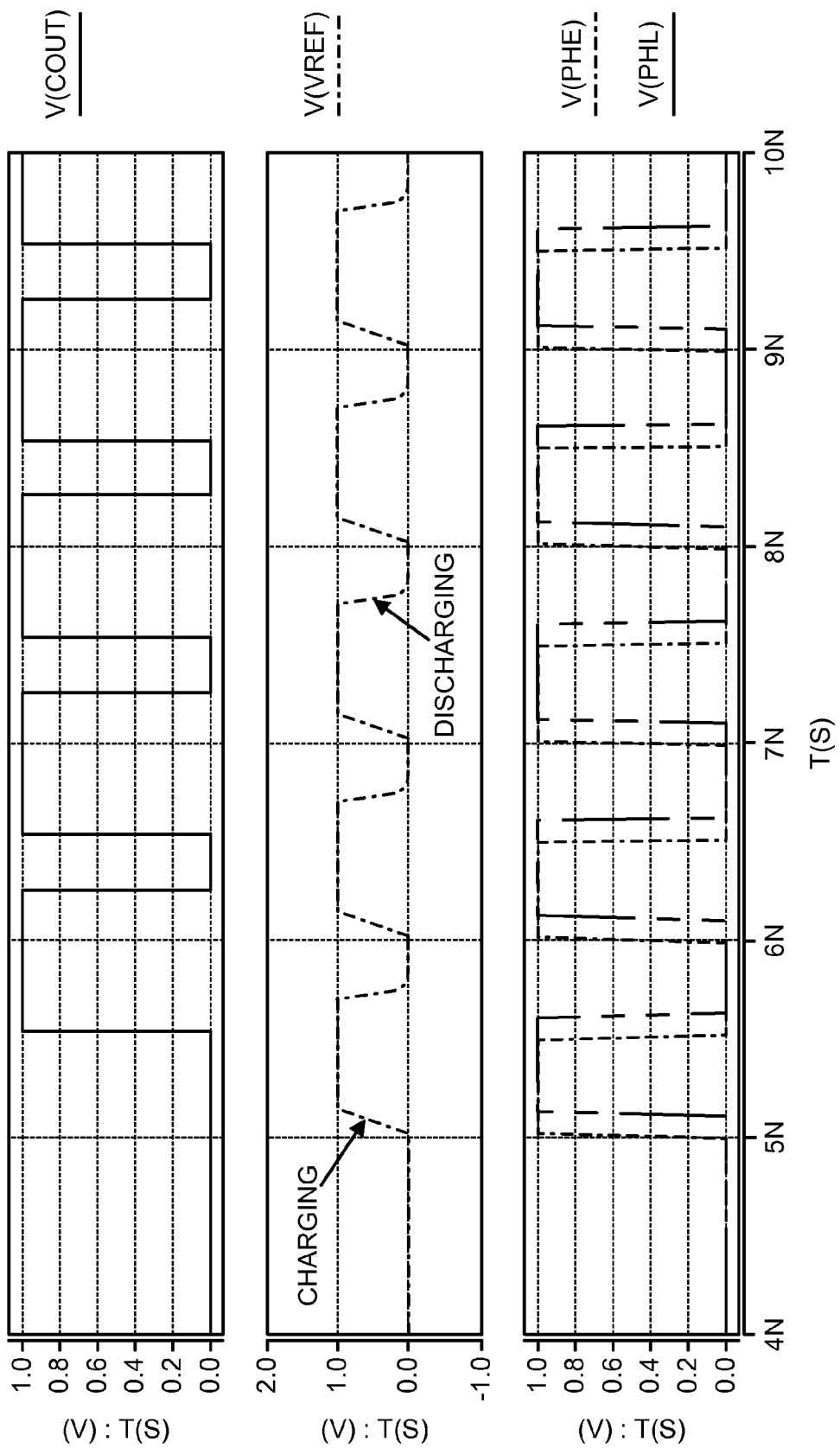
FIG. 4 is a timing diagram of a reference voltage charging and discharging.

FIGS. 4-8 show various simulation graphs of various waveforms of the circuit 100. Referring to FIG. 4, the bottom graph shows the signal PHE and the signal PHL across time. The mid-graph shows a waveform representing the signal VREF. This signal VREF starts ramping from 0 when the signal PHE transitions from low to high. The signal VREF stops ramping when the signal PHL transitions from low to high. At the time when the signal COUT is high, and both the signal PHE and the signal PHL are low, the signal VREF is discharged to ground (or 0). Until this time, the signal VREF remains at a particular value (e.g., IV in this case). The operation is shown across multiple cycles of the signal PHE and the signal PHL.

Figure 5:
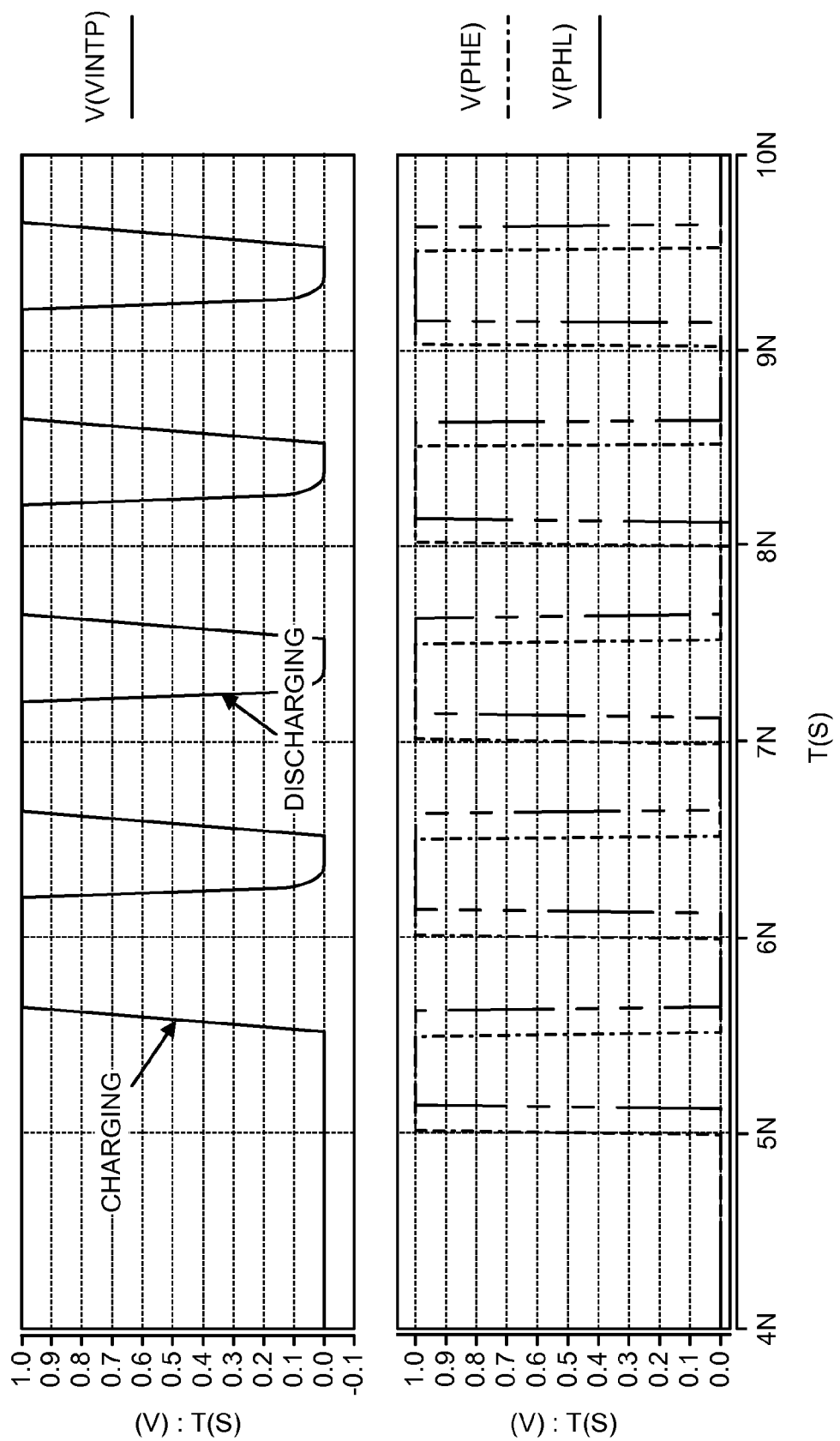
FIG. 5 is a timing diagram of an input voltage charging and discharging.

Referring to FIG. 5, the bottom graph shows the signal PHE and the signal PHL. The top graph shows a waveform representing the signal VINTP. The signal VINTP starts ramping from 0 when the signal PHE transitions from high to low. The signal VINTP stops ramping when the signal PHL transitions from high to low. At the time when both the signal PHE and the signal PHL are low, the signal VINTP is discharged to ground (e.g., 0). Until this time, the signal VINTP remains at a particular value (e.g., 1V in this case). The operation is shown across multiple cycles of the signal PHE and the signal PHL.

Figure 6:
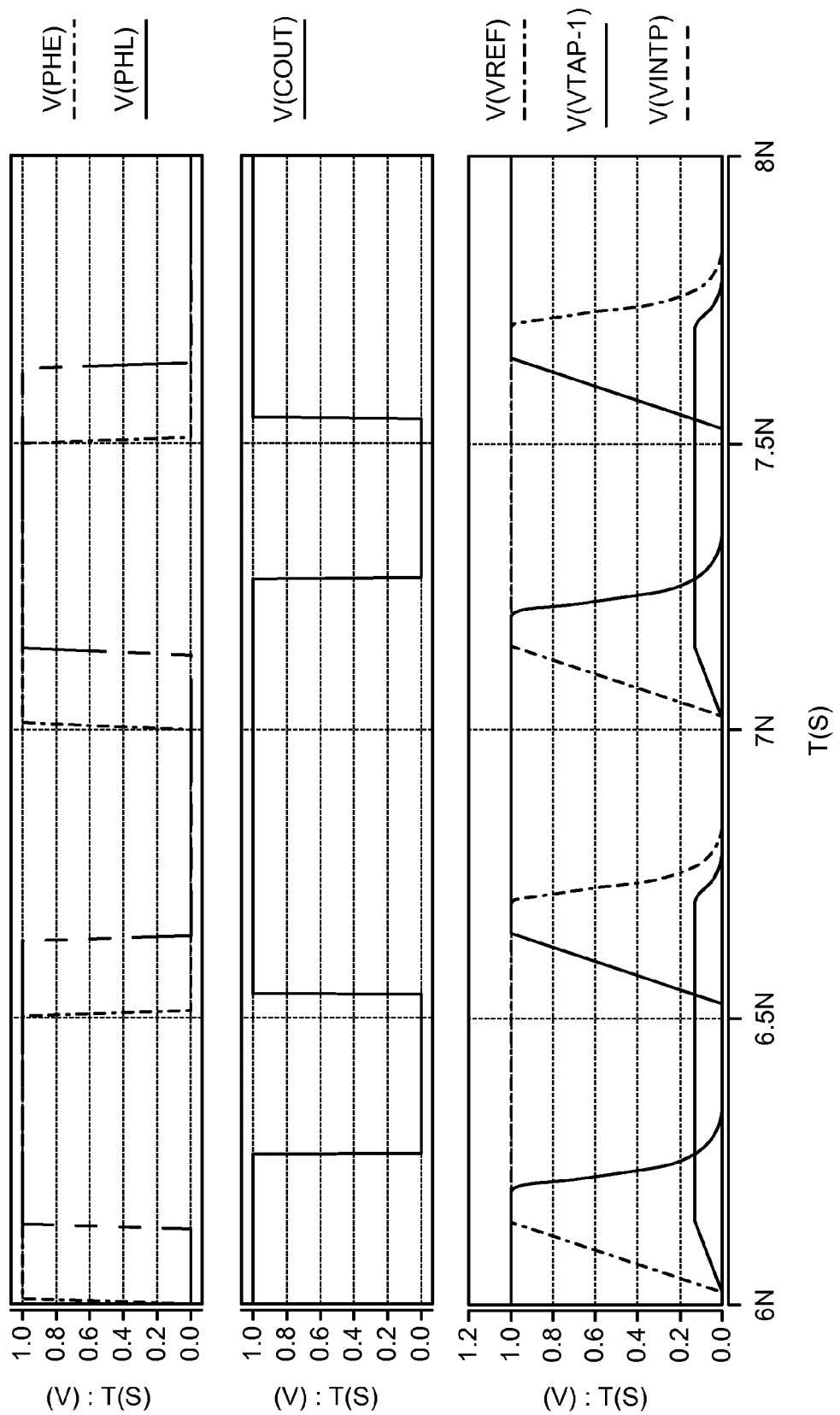
FIG. 6 is a timing diagram of an interpolated clock generation process.

Referring to FIG. 6, the top graph shows the signal PHE and the signal PHL. The bottom graph shows a waveform representing the signal VREF. The signal VREF starts ramping from 0 when the signal PHE transitions from low to high. The signal VREF stops ramping when the signal PHL transitions from low to high. At the time when the signal COUT is high, and the signal PHE and the signal PHL are low, the voltage VREF is discharged to ground (e.g., 0). Until this time, the signal VREF remains at a particular value (e.g., 1V in this case). The graph also shows a waveform representing the signal VINTP. The signal VINTP starts ramping from 0 when the signal PHE transitions from high to low. The signal VINTP stops ramping when the signal PHL transitions from high to low. At the time when both the signal PHE and the signal PHL are low, the voltage VINTP is discharged to ground (e.g., 0). Until this time, the signal VINTP remains at a particular value (e.g., 1V in this case). The bottom graph also shows a waveform of the voltage VTAP-1, which is the waveform of voltage VTAP when the TAP 1 is selected in resistor ladder 104. As the signal VINTP transitions above VTAP-1, the signal COUT is high and stays high till the signal VINTP transitions below VTAP-1. In general, the signal COUT is a phase shifted waveform with phase shift equal to Tp/8. The operation is shown across multiple cycles of the signal PHE and the signal PHL.

Figure 7:
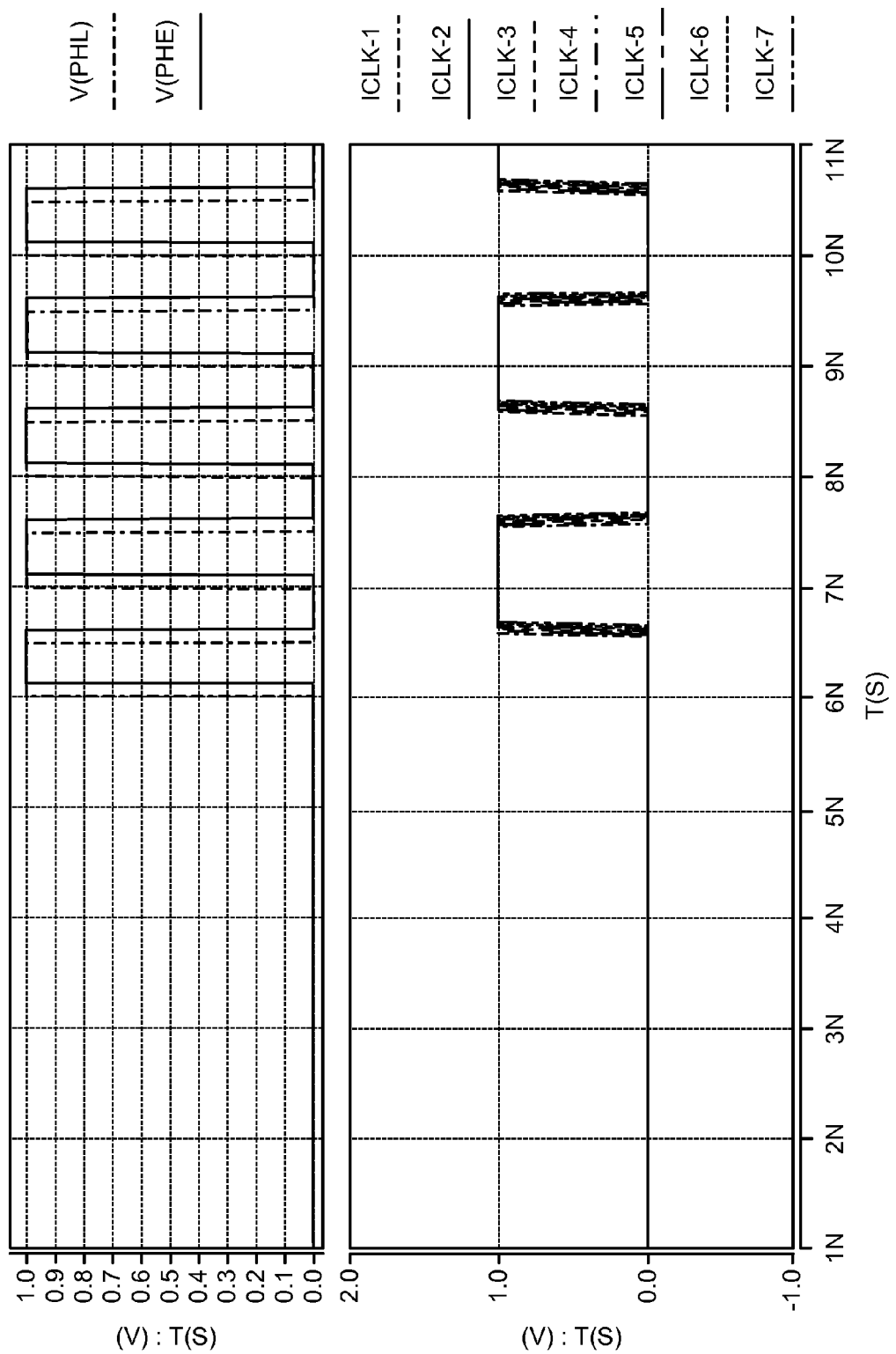
FIG. 7 is a timing diagram of two phases showing an interpolated clock.

Referring to FIG. 7, the top graph shows the signal PHE and the signal PHL. The bottom graph shows a number of signals ICLK-1 to ICLK-7. The signals ICLK-1 to ICLK-7 represent a set of interpolated waveforms. The signal ICLK-1 is a waveform of the signal ICLK when the TAP1 is selected. The signal ICLK-7 represents the signal ICLK when the TAP7 is selected.

Figure 8:
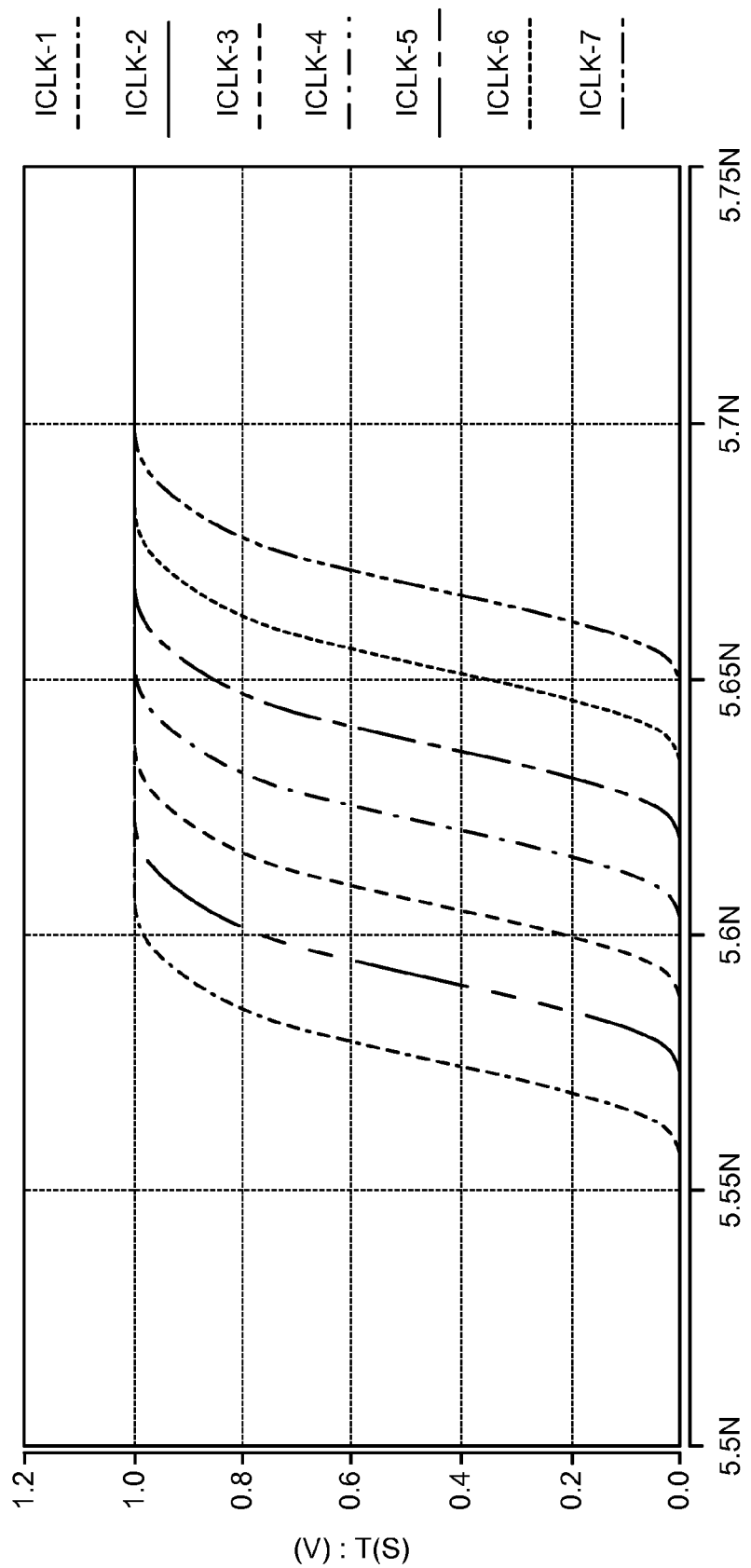
FIG. 8 is a timing diagram of an interpolated clock signal over a number of taps.

Referring to FIG. 8, the zoomed picture of the interpolated waveforms ICLK-1 to ICLK-7 with spacing between consecutive waveform equal to Tp/8 is shown.

Until the signal RESET transitions high, the output interpolated clock ICLK (and all the respective intermediate voltages) are zero. When the signal RESET is released, the phase interpolation begins. When both the signal PHE and the signal PHLB are high (e.g., during the period Tp), the switch SW2 turns ON. The current source IREF starts charging the capacitor CREF. The charging stops when the signal PHLB transitions low. At this time, the switch SW2 turns OFF and the switch SW1 turns ON. At the end of this period, the voltage on the capacitor CREF is generally the reference voltage VREF. The reference voltage VREF is buffered as the voltage VREF-BUF and then divided into eight equal parts using the resistor ladder R0-R7.

When the signal PHEB and the signal PHL both are high, the switch SW5 turns ON. The current source IINTP starts charging the capacitor CINTP. The charging stops when the signal PHL transitions low. The switch SW5 then turns OFF and the switch SW4 turns ON. At the end of this period, the voltage on the capacitor CINTP is generally the voltage VINTP. At such time, the value of current sources IREF and IINTP are equal. The two capacitors CREF and CINTP are also normally substantially equal in value. By virtue of these equalities, and the phase relationship between the signal PHE and the signal PHL, the time for which the switches SW4 and SW5 are ON, is normally equal and is Tp. The two voltages VREF and VINTP are also equal. The phase difference may be interpolated by selecting one of the taps of resistor ladder R0-R7 to compare to the voltage VINTP. The particular number of resistors R0-R7 implemented may be varied (e.g., increased or decreased) to meet the design criteria of a particular implementation.

The interpolated phase may have resolution of Tp/8 as the voltage VREF is divided into eight equal parts. When the voltage VINTP crosses the voltage VTAP, the comparator output COUT transitions high. When the signal COUT is high, and both the signal PHE and the signal PHL are low, the reference capacitor CREF is discharged to ground. The next time both the signal PHE and the signal FHLB are high, the discharging stops and the capacitor CREF is once again charged to VREF. The other capacitor CINTP is generally discharged to ground when both the signal PHE and the signal PHL are high. During this time, the output COUT of the comparator 226 transitions low. The next time both the signal PHEB and the signal PHL are high, the discharging stops and the capacitor CINTP is once again charged to the voltage VINTP and again the output of the comparator 226 transitions high. This way the cycle repeats.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed)to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:
1. An apparatus comprising:
  a reference circuit configured to generate a reference signal in response to (i) a clock signal, (ii) a first phase signal and (iii) a second phase signal;
  a resistor ladder circuit configured to generate a tap voltage in response to said reference signal, wherein said tap voltage is generated by enabling one or more of a plurality of tap resistors; and
  an output circuit configured to generate an adjusted clock signal in response to (i) said tap voltage, (ii) said clock signal, (iii) said first phase signal, (iv) said second phase signal, and (v) a reset signal, wherein (A) said adjusted clock signal has an adjusted phase with respect to said clock signal and (B) said tap voltage represents a threshold voltage used for generating transitions on said adjusted clock signal.

2. The apparatus according to claim 1, wherein said output circuit comprises a capacitor configured to provide phase interpolation in response to said first phase signal and said second phase signal.

3. The apparatus according to claim 1, wherein (i) said first phase signal comprises a phase early signal, (ii) said second phase signal comprises a phase late signal, and (iii) a difference between said first phase signal and said second phase signal comprises a phase difference.

4. The apparatus according to claim 1, wherein a phase difference is generated in response to a difference between said first phase signal and said second phase signal.

5. The apparatus according to claim 4, wherein said adjusted phase is based on said phase difference.

6. The apparatus according to claim 1, wherein said apparatus is part of a phase Locked Loop (PLL) circuit.

7. The apparatus according to claim 1, wherein said apparatus is part of a data and clock recovery (DCR) circuit.

8. The apparatus according to claim 1, wherein said resistor ladder circuit comprises 8 resistors.

9. An apparatus comprising:
   means for generating a reference signal in response to (i) a clock signal, (ii) a first phase signal and (iii) a second phase signal;
   means for generating a tap voltage a resistor ladder circuit in response to said reference signal, wherein said tap voltage is generated by enabling one or more of a plurality of tap resistors; and
   means for generating an adjusted clock signal in response to (i) said tap voltage, (ii) said clock signal, (iii) said first phase signal, (iv) said second phase signal, and (v) a reset signal, wherein (A) said adjusted clock signal has an adjusted phase with respect to said clock signal and (B) said tap voltage represents a threshold voltage used for generating transitions on said adjusted clock signal.

10. A method for implementing phase interpolation using a resistor ladder, comprising the steps of:
   (A) generating a reference signal in response to (i) a clock signal, (ii) a first phase signal and (iii) a second phase signal;
   (B) generating a tap voltage a resistor ladder circuit in response to said reference signal, wherein said tap voltage is generated by enabling one or more of a plurality of tap resistors; and
   (C) generating an adjusted clock signal in response to (i) said tap voltage, (ii) said clock signal, (iii) said first phase signal, (iv) said second phase signal, and (v) a reset signal, wherein (A) said adjusted clock signal has an adjusted phase with respect to said clock signal and (B) said tap voltage represents a threshold voltage used for generating transitions on said adjusted clock signal.

* * * * *